United States Patent [19]

Waehner

[11] 3,772,606

[45] Nov. 13, 1973

[54] MULTI-LEVEL POWER AMPLIFIER

[75] Inventor: Glenn C. Waehner, Riverside, Conn.

[73] Assignee: United Aircraft Corporation, East Hartford, Conn.

[22] Filed: Jan. 28, 1972

[21] Appl. No.: 222,204

[52] U.S. Cl. .......................... 330/13, 330/22, 330/40

[51] Int. Cl. .............................................. H03f 3/18

[58] Field of Search ..................... 330/13, 22, 40, 15

[56] References Cited

UNITED STATES PATENTS 3,622,899 11/1971 Eisenberg ............................ 330/22

3,483,425 12/1969 Yanishevsky ................. 330/40 UX

*Primary Examiner*—Roy Lake

*Assistant Examiner*—James B. Mullins

*Attorney*—Melvin Pearson Williams

[57] ABSTRACT

The collector voltages of a complementary emitter follower are maintained at a low voltage level when low levels of voltage are provided by the complementary emitter follower to a load. High levels of voltage are provided to the load through the complementary emitter follower by one of two auxiliary emitter followers, in response to input voltages in excess of that required to saturate the complementary emitter follower.

4 Claims, 3 Drawing Figures

MULTI-LEVEL POWER AMPLIFIER

BACKGROUND OF THE INVENTION

1. Field of Invention

This invention relates to electrical signal amplifiers and more particularly to a circuit for a linear power amplifier.

2. Description of the Prior Art

Linear power amplifiers that are known in the prior art may be inefficient because at low and intermediate levels of the output voltage, a substantial voltage is sustained across an output device, such as an output transistor, that provides excitation to a load. Typical of linear power amplifiers known in the prior art, the class A amplifier has been characterized as having a maximum efficiency of 50 percent and the class B amplifier has been characterized as having a maximum efficiency of about 64 percent.

One cause of inefficiency is the high voltage sustained from the collector to the emitter of the output transistor because of the usual requirement that the amplifier provide load voltages of a multiplicity of amplitudes; the operating voltage of the output transistor is therefore sufficiently large to accommodate the largest load voltage. A high voltage (equal to the difference between the operating voltage and the load voltage sustained from the collector to the emitter at times when a low load voltage at a high load current level is provided, causes a high average voltage-current product (dissipated power) across the output transistor. The dissipated power caused by inefficiency may result in excessive heating and necessitate a large output transistor mounted upon a large heat sink.

It has been recognized in the prior art that amplifiers of higher efficiency are obtained by providing a high operating voltage to an output transistor when a high load voltage is required, and providing a reduced operating voltage when a low load voltage is required. The subject matter of the Yanishevsky U.S. Pat. No. 3,484,425 is an example of a circuit for varying the operating voltage. Yanishevsky, however, requires the use of comparators and "hard" switching that tend to make an amplifier complex and may introduce switching transients into the load voltage.

SUMMARY OF THE INVENTION

The object of the present invention is the provision of efficient power amplifiers.

According to the present invention, an output emitter follower provides the load voltage to a load in response to an applied signal voltage; at load voltages below a selected level, a low operating voltage provided by a low voltage source is applied to the collector of the emitter follower through a diode poled for conduction; a high operating voltage provided by a high voltage source is applied to an auxiliary device which provides load voltages above the selected level through the output emitter follower to the load, disconnecting the low operating voltage by causing the diode to be poled for non-conduction, thereby reducing the total power dissipated.

One embodiment of the present invention is particularly suited to provide an amplifier stage that drives an inductive load because the load current is from a low operating voltage source at low frequencies so that the power dissipated by the stage is low. The load current is from a high operating voltage source only when there is a rate of change of load current requiring a high load voltage.

DESCRIPTION OF THE PREFERRED EMBODIMENT

Figure 1:
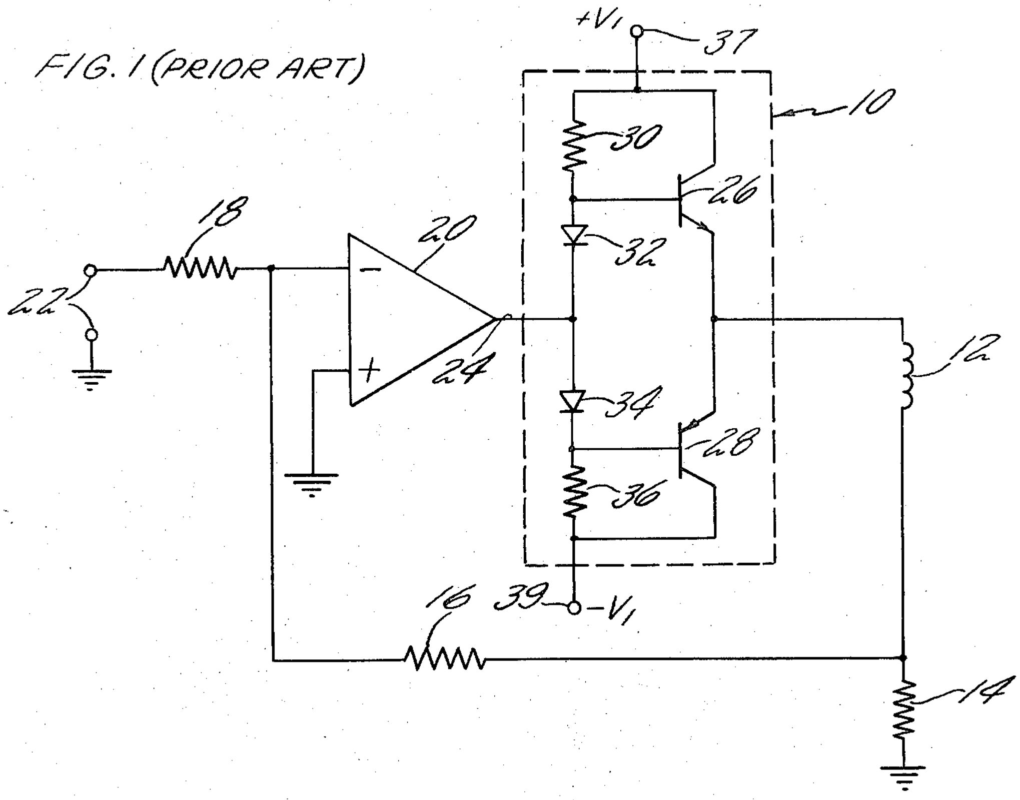
FIG. 1 (PRIOR ART)
FIG. 1 is a schematic diagram of a magnetic deflection amplifier known to the prior art.

Referring now to FIG. 1, a power amplifier stage 10, known to the prior art, is a component of a well known type of magnetic deflection amplifier that provides the deflection current to a magnetic deflection yoke 12. The deflection amplifier is additionally comprised of a sampling resistor 14 (on the order of 1 ohm), a feedback resistor 16 (of much larger resistance than the sampling resistor 14), an input resistor 18, and an operational amplifier 20; the deflection amplifier provides the deflection current in proportion to an input voltage provided at input terminals 22. The load voltage provided to the yoke 12 is substantially equal to the voltage provided on the line 24.

The stage 10 is comprised of a complementary emitter follower and associated input circuitry that is connected through a signal line 24 to the output of the operational amplifier 20. The elements of the complementary emitter follower are an NPN transistor 26 and a PNP transistor 28 which provide a current source and a current sink respectively, for the deflection current.

The input circuitry is comprised of a series combination of a resistor 30, a diode 32, a diode 34 and a resistor 36, the output of the operational amplifier 20 being connected to the cathode of the diode 32 and the anode of the diode 34. Transistor operating voltages $+V_1$, $-V_1$ ($V_1$ is typically on the order of 30 volts) are applied to terminals 37, 38 respectively, thereby providing the collector voltages for the complementary emitter follower and a potential that causes a bias voltage to appear from the anode of the diode 32 (the base of transistor 26) to the cathode of the diode 34 (the base of transistor 28). The diodes 32, 34 and the resistors 30, 36 conduct a bias current which causes the diodes 32, 34 each to provide a constant bias voltage (very much like a battery) and present a very low impedance to the signal voltage on the line 24. The bias voltage causes the low level of current in the transistors 26, 28 that eliminates the "crossover distortion " known to the art. This phenomena relates to the fact that due to the operating thresholds of the transistors, as voltages applied to the stage 10 change from positive to negative, there may be a dead space on both sides of zero voltage where neither transistor operates. Thus a small bias ensures that, depending on the input voltage polarity, one of the transistors will operate right down to zero volts.

At times, the stage 10 may provide a very high current at very low frequency (or low change rate) to the yoke 12. Because there is little voltage drop across an inductor at low frequencies, only a very small voltage is required to provide a low frequency current therethrough. Because the sampling resistor 14 is extremely small, only a very small voltage will be dropped across it. Under such a circumstance, the difference between the voltage supply ($V_1$) and the low voltage supplied to the yoke 12 is all dropped across one of the transistors 26, 28. With a high voltage drop and high current through the transistor, there is a large power dissipation in the transistor. The resulting heating of the transistor may necessitate that it be a large device, with a high power dissipation capability; it may further require that the transistors 26, 28 be mounted on large, efficient heat sink packages. A further problem is the necessity of providing voltage sources ($+V_1$ and $-V_1$) which have a high power delivery capability.

Figure 2:
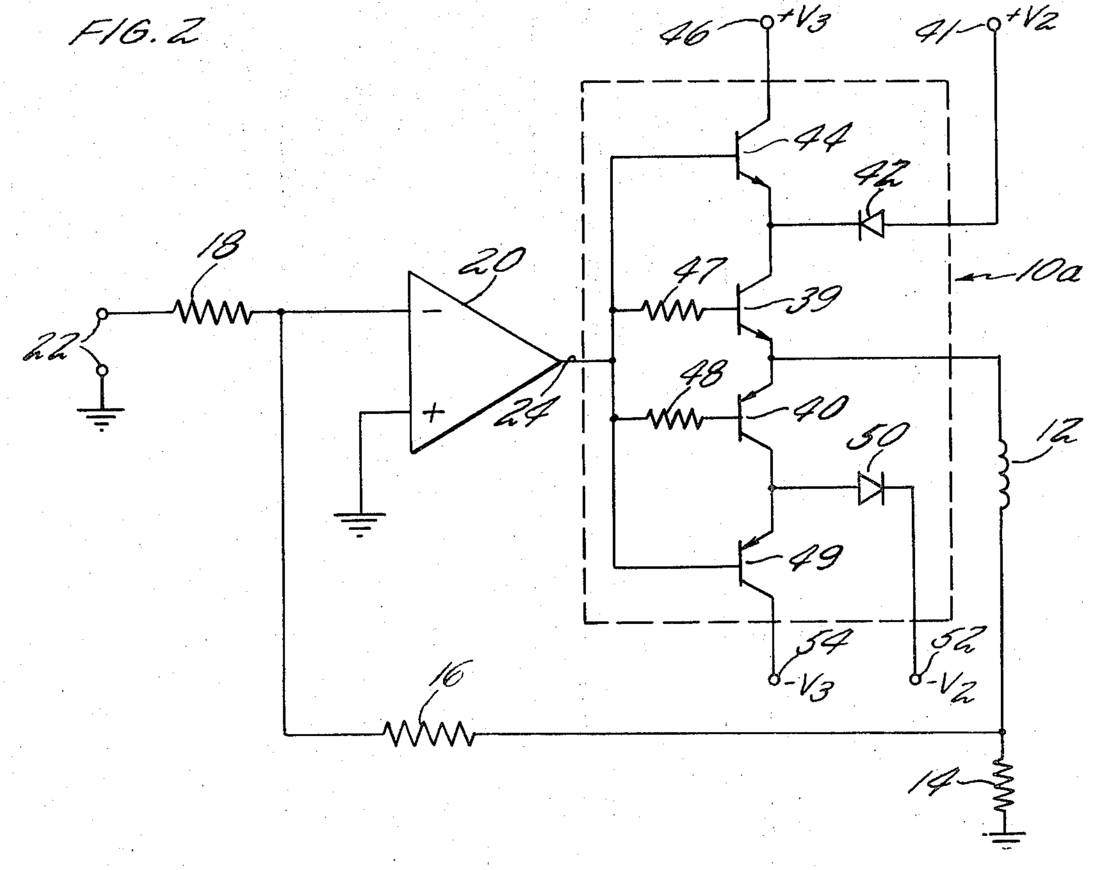
FIG. 2 is a schematic diagram of a simplified embodiment of the present invention.

For illustrative purposes and in order to simplify the teachings of the invention, consider the simplified embodiment shown in FIG. 2. A simplified power stage 10a includes a complementary emitter follower comprised of transistors 39, 40 which provide excitation to the yoke 12. A positive low voltage, $+V_2$, is applied to a terminal 41 which is connected to the collector of the transistor 38 through a diode 42 ($V_2$ is typically 13 volts). A first auxiliary emitter follower comprised of the transistor 44 has its emitter connected to the cathode of the diode 42 and the collector of the transistor 39. A positive high operating voltage, $+V_3$, is applied to a terminal 46 which is connected to the collector of the transistor 44 ($V_3$ is typically two or three times greater than $V_2$). The base of each transistor 39, 40 is connected through related resistors 47, 48 to the output 24 of the amplifier 20.

Positive voltages on the line 24 less than $+V_2$ are substantially applied by the transistor 39 to the yoke 12 (as in FIG. 1). In such a case, the emitter of the transistor 44 is at a higher voltage (substantially equal to $+V_2$) than the base thereof, thereby causing non-conduction of the transistor 44 and effectively disconnecting it so that it has no effect upon the voltage at the collector of the transistor 39.

A positive voltage on the line 24 that is greater than $+V_2$ causes saturation of transistor 39; base current causes a voltage across the resistor 47 to push the base of transistor 44 more positive than the collector thereof, in turn causing conduction of the transistor 44; the voltage at the emitter thereof (and the collector of the transistor 39) exceeds $+V_2$, thereby causing the diode 42 to be back biased so that it isolates the operating voltage $+V_2$ from the collector of the transistor 39. When the transistor 44 is in conduction, the transistor 39 is saturated and acts as a conductor for the application of the high positive load voltage by the transistor 44 to the coil 12.

The transistor 40, a second auxiliary emitter follower comprised of a transistor 49, a diode 50, a negative low operating voltage, $-V_2$, applied to a terminal 52 and a negative high operating voltage, $-V_3$, applied to a terminal 54 provide negative load voltages in a manner analogous to the application of positive load voltages described hereinbefore.

The transition of the transistor 39 (or 40) from the low load voltage mode of operation to saturation (caused by high load voltages) usually occurs slightly prior to operation of the transistor 44 (or 48); this may cause a small undesired transient at the load. Additionally, saturation of the transistors 39, 40 may tend to degrade the frequency response of the stage 10*a*.

Thus, in this embodiment of the present invention, one of two sources of low operating voltages (having the same magnitude but opposite polarity) is applied to each of the collectors of a complementary emitter follower in response to load voltages below a selected amplitude provided at the output thereof. One of two sources of high operating voltages (having the same magnitude but of opposite polarity) is applied to each of two auxiliary devices, such as auxiliary emitter followers, one of which provides higher load voltages (above the selected amplitude of load voltage) in response to a positive input signal, the other providing higher load voltages in response to a negative input signal, the complementary emitter follower being used as a conductor to the load. Conduction of one of the auxiliary emitter followers causes one of the sources of low operating voltage to be disconnected from the complementary emitter follower and conduction of the other auxiliary emitter follower causes the other low operating voltage to be disconnected. The total power dissipated by the auxiliary and complementary emitter followers is related to the time weighted average of the high operating voltage and the low operating voltage, the weighting being proportional to the time that the respective sources thereof provide current to the load.

Figure 3:
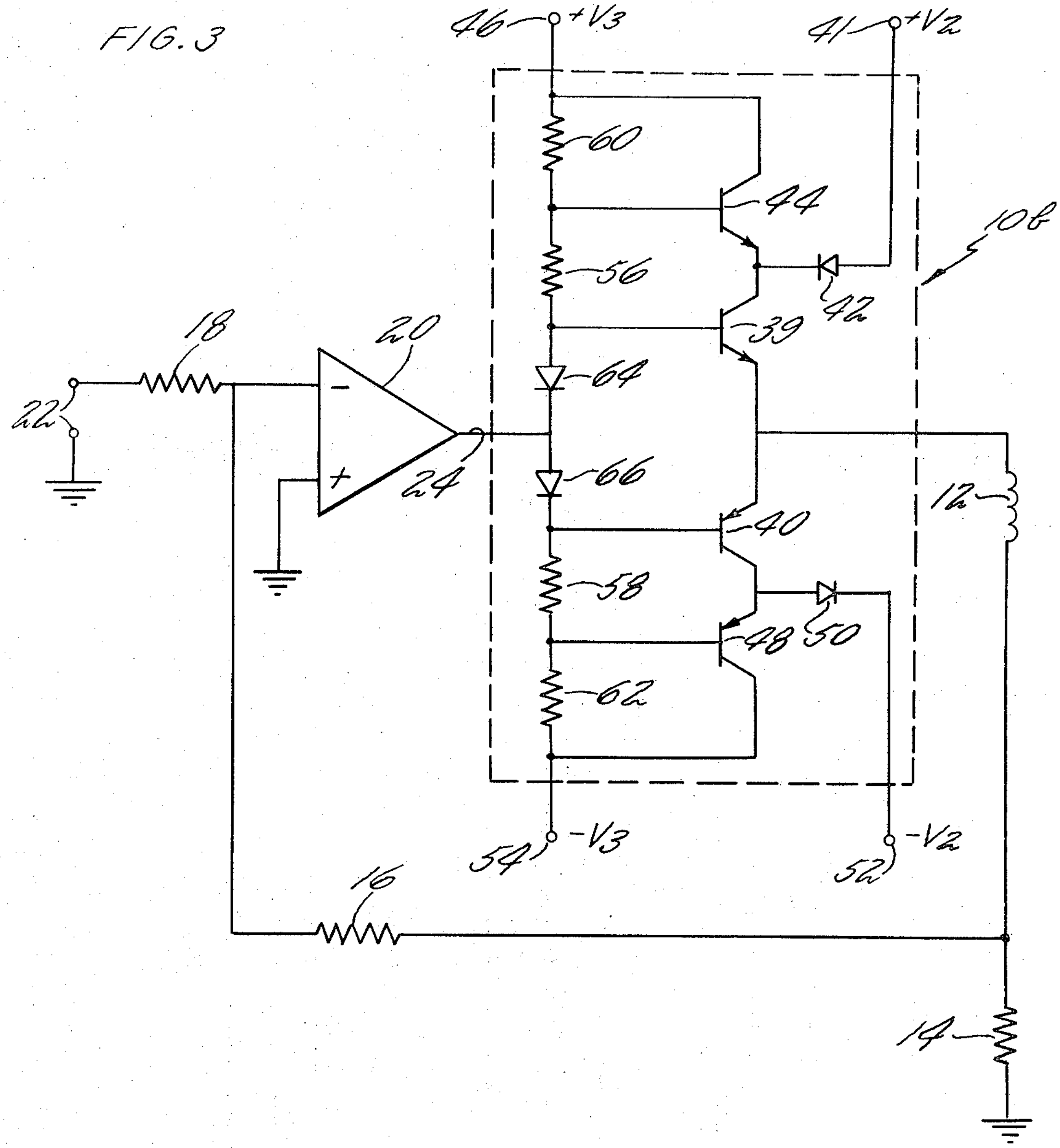
FIG. 3 is a schematic diagram of a preferred embodiment of the present invention.

In the preferred embodiment of the present invention shown in FIG. 3, saturation of the transistors 39, 40 is prevented by a bias circuit comprising a first pair of resistors 56, 58, each having equal resistances much less than a second pair of equal resistors 60, 62. A bias current flows between the sources of the operating voltages $+V_3$, $-V_3$ through the resistors 56, 58, 60, 62 and diodes 64, 66, causing small anti-saturation bias voltages to be developed across the resistors 56, 58. The anti-saturation bias boltage across the resistor 56 causes the base of the transistor 44 to be at a more positive potential than the base of the transistor 39. The signal voltage on the line 24 is transmitted through the forwardly biased diode 64 and through the resistor 56 to the base of the transistor 44 at substantially the same level because the resistor 56 is much smaller than the resistor 60 so that vitually none of the signal voltage is dropped across the resistor 56. Because of the anti-saturation bias voltage and the equality of the signal voltages at the bases of the transistors 38, 44, positive voltages on the line 24 greater than a selected voltage substantially equal to $V_2$ minus the anti-saturation bias voltage, cause the transistor 44 to provide a voltage to the collector of the transistor 39 that is more positive than the load voltage (by substantially the anti-saturation bias voltage minus the base to emitter voltage drop of the transistor 44, which is typically 0.7 volts for a silicon transistor). In a manner analogous to the prevention of the saturation of the transistor 39, saturation of the transistor 40 is prevented by the resistor 58 and the resistor 62 when negative voltages are provided to the stage 10*b* by the amplifier 20.

The diodes 64, 66 eliminate "crossover distortion" in the manner described with respect to FIG. 1 hereinbefore.

Although the present invention may be used for driving loads of any impedance, it is especially suited for driving a magnetic deflection yoke. In a CRT display using magnetic deflection, large voltages across the yoke are only required to cause a large rate of change of deflection current. In a typical CRT display utilizing a raster, the only time that a large rate of change of the deflection current is required (and therefore a large deflection voltage) is during a retrace interval when the beam of the CRT is rapidly swept from one side of the CRT to the other. It may therefore be desirable to select operating voltages $V_2$, $V_3$, so that $V_3$ provides current to the yoke only during the retrace interval. In a stroke written display, a large rate of change of deflection current is usually required only when the beam is being repositioned on the screen of the CRT; small deflections and therefore low load voltages are usually associated with writing a character on the face of the CRT. It may therefore be desirable to select operating voltages $V_2$, $V_3$, so that $V_3$ provides current to the yoke only when the beam is being repositioned, $V_2$ being of sufficient magnitude to cause the lower rate of change of current in the yoke that is required for writing the strokes comprising a character. In driving a yoke in a display using either a stroke generator or a raster, since the high voltages ($V_3$) are usually used less than 20 percent of the time, the present invention may enable a power saving on the order of 65 percent, the exact percentage depending upon the relative amplitudes of the voltages $V_2$, $V_3$ and the relative times of their usage.

It should be understood that the present invention may be provided as an improvement to the invention disclosed in the applicant's copending application, WIDE-BAND MAGNETIC YOKE DEFLECTION SYSTEM, filed Feb. 8, 1971 and assigned Ser. No. 11,321, and now abandoned.

Although the invention has been shown and described with respect to preferred embodiments thereof, it should be understood by those skilled in the art that various changes and omissions in the form and detail thereof may be made therein without departing from the spirit and the scope of the invention.

Having thus described typical embodiments of my invention, that which I claim as new and desire to secure by Letters Patent of the United States is:

1. A bipolar multilevel power amplifier circuit for driving a load in response to an input voltage, comprising:

a complementary emitter follower stage including a pair of saturable transistors of opposite conductivity type being connected in a common emitter configuration with said load, the base of each of said saturable transistors being connected through a respective diode to the input voltage;

a pair of first power supplies of opposite polarity, each interconnected with the collector of a corresponding one of said saturable transistors, each providing a voltage of substantially the same magnitude as the voltage required at the base of the related saturable transistor to saturate the same;

a plurality of auxiliary transistors, at least one corresponding to each of said saturable transistors, each auxiliary transistor being of the same conductivity type as the saturable transistor with which it corresponds, the emitter of at least one of said auxiliary transistors of each conductivity type being connected to the collector of the corresponding one of said saturable transistors;

a plurality of second power supplies, each interconnected with the collector of a corresponding one of said auxiliary transistors, each providing a voltage of the same polarity as and a greater magnitude than the voltage provided by related ones of said first power supplies; and bias means for interconnecting the base of said auxiliary transistors for response to the input signal, said bias means providing, for an input signal of any given magnitude, a signal at the base of said auxiliary transistor which is greater in magnitude than the signal at the base of the corresponding one of said saturable transistors, said bias means comprising, with said second power supplies, a resitor connected between the collector and the base of each of said auxiliary transistors and a resistor connected between the base of each of said auxiliary transistors and the base of the corresponding one of said saturable transistors.

2. A unipolar multilevel power amplifier circuit for driving a load in response to an input voltage, comprising:

an emitter follower stage including a saturable transistor having its emitter connected to said load, the base of said saturable transistor being connected through a diode to the input voltage;

a first power supply connected to the collector of said saturable transistor and providing a voltage of substantially the same magnitude as the voltage required at the base of said saturable transistor to saturate the same;

an auxiliary transistor of the same conductivity type as said saturable transistor, the emitter of said auxiliary transistor being connected to the collector of said saturable transistor;

a second power supply connected to the collector of said auxiliary transistor and providing a voltage of the same polarity as and a greater magnitude than the voltage provided by said first power supply; and bias means for interconnecting the base of said auxiliary transistor for response to the input signal, said bias means providing, for an input signal of any given magnitude, a signal at the base of said auxiliary transistor which is greater in magnitude than the signal at the base of said saturable transistor, said bias means comprising, with said second power supply, a resistor connected between the collector and the base of said auxiliary transistor and a resistor connected between the base of said auxiliary transistor and the base of said saturable transistor.

3. A bipolar multilevel power amplifier circuit for driving a load in response to an input voltage, comprising:

a complementary emitter follower stage including a pair of saturable transistors of opposite conductivity type being connected in a common emitter configuration with said load, the base of each of said transistors being connected through a resistor to the input voltage;

a pair of first power supplies of opposite polarity, each connected to the collector of a corresponding one of said saturable transistors and providing a voltage of substantially the same magnitude as the input voltage required to saturate the related saturable transistor;

a plurality of auxiliary transistors, at least one corresponding to each of said saturable transistors, each auxiliary transistor being of the same conductivity type as the saturable transistor with which it corresponds, the emitter of at least one of said auxiliary transistors of each conductivity type being connected to the collector of the corresponding one of said saturable transistors, the base of each of said auxiliary transistors connected directly to the input voltage; and a plurality of second power supplies, each interconnected with the collector of a corresponding one of said auxiliary transistors, each providing a voltage of the same polarity as and a greater magnitude than the voltage provided by related ones of said first power supplies.

4. A unipolar multilevel power amplifier circuit for driving a load in response to an input voltage, comprising:

an emitter follower stage including a saturable transistor having its emitter connected to said load, the base of said transistor being connected through a resistor to the input voltage;

a first power supply connected to the collector of said saturable transistor and providing a voltage of substantially the same magnitude as the input voltage required to saturate said saturable transistor;

an auxiliary transistor of the same conductivity type as said saturable transistor, the emitter of said auxiliary transistor being connected to the collector of the said saturable transistor, the base of said auxiliary transistor connected directly to the input voltage; and a second power supply connected to the collector of said auxiliary transistor and providing a voltage of the same polarity as and a greater magnitude than the voltage provided by said first power supply.

* * * * *